United States Patent
Fischer et al.

(10) Patent No.: US 6,567,454 B1
(45) Date of Patent: May 20, 2003

(54) COUPLED-RESONATOR VERTICAL-CAVITY LASERS WITH TWO ACTIVE GAIN REGIONS

(75) Inventors: Arthur J. Fischer, Albuquerque, NM (US); Kent D. Choquette, Urbana, IL (US); Weng W. Chow, Cedar Crest, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 09/847,177

(22) Filed: May 1, 2001

(51) Int. Cl.[7] ............................. H01S 3/082; H01S 5/00
(52) U.S. Cl. ........................ 372/68; 372/50; 372/96
(58) Field of Search ........................ 372/43–46, 68, 372/96, 50

(56) References Cited

U.S. PATENT DOCUMENTS

| | | | | |
|---|---|---|---|---|
| 5,013,684 A | * | 5/1991 | Epler et al. ................... | 438/36 |
| 5,513,204 A | * | 4/1996 | Jayaraman ................... | 372/96 |
| 5,956,363 A | * | 9/1999 | Lebby et al. ................ | 372/46 |
| 6,285,704 B1 | * | 9/2001 | Kullander-Sjoberg et al. ... | 372/96 |

* cited by examiner

*Primary Examiner*—Paul Ip
*Assistant Examiner*—James Menefee
(74) *Attorney, Agent, or Firm*—Brian W. Dodson

(57) ABSTRACT

A new class of coupled-resonator vertical-cavity semiconductor lasers has been developed. These lasers have multiple resonant cavities containing regions of active laser media, resulting in a multi-terminal laser component with a wide range of novel properties.

7 Claims, 1 Drawing Sheet

COUPLED-RESONATOR VERTICAL-CAVITY LASERS WITH TWO ACTIVE GAIN REGIONS

GOVERNMENT RIGHTS

Figure 1:
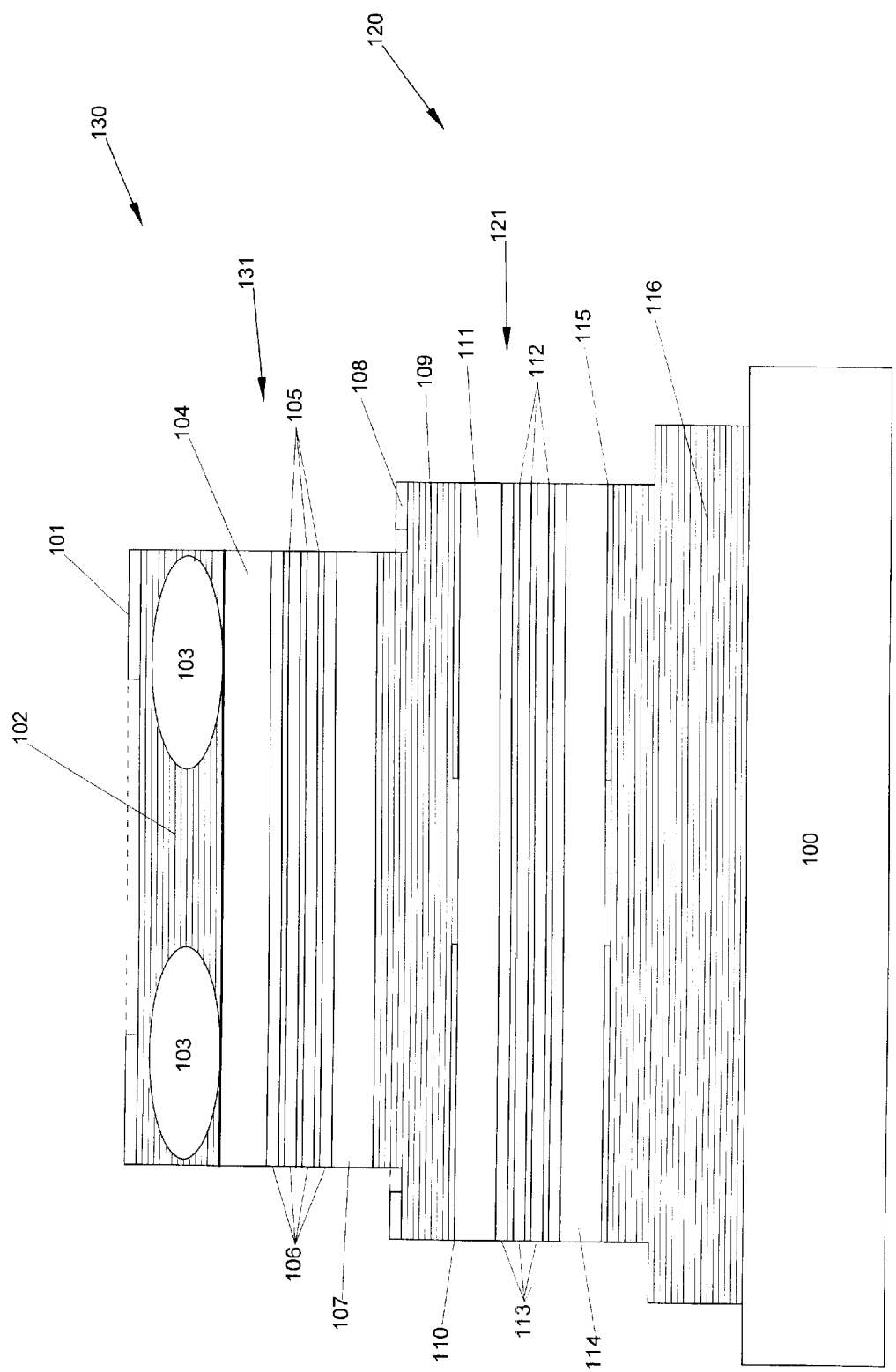

This invention was made with Government support under Contract DE-AC04-94AL85000 awarded by the U.S. Department of Energy. The Government has certain rights in the invention.

FIELD OF THE INVENTION

The present invention relates generally to semiconductor lasers, and more specifically to coupled resonator vertical-cavity lasers having multiple active gain regions.

BACKGROUND OF THE INVENTION

Conventional vertical-cavity surface emitting lasers (VCSELs) generally comprise a slab of active laser gain medium sandwiched between a pair of dielectric mirrors, these substructures being monolithically integrated on the surface of a semiconductor substrate. Such devices are usually lattice-matched or strained-layer structures, made of single-crystal direct-gap semiconductor materials. The most common materials used for construction are gallium arsenide based semiconductor alloys.

VCSELs are typically constructed as a vertical stack of layers on a substrate, and are configured so that the laser light they generate is emitted substantially normal to the surface of the substrate. As a result, VCSELs can be effectively used to optically transfer information from one subsystem to another, either via free-space coupling or by coupling to a fiber optic.

Another common application for VCSELs is to form a linear or two-dimensional matrix of laser emitters. Such a matrix can have close (~100 micron) spacing, enabling very dense matrices having a large total number of emitters. VCSELs are also used for many other applications for which edge-emitting semiconductor lasers are not well suited.

There are many applications for which the performance of lasers can be improved from that of the simple VCSEL described above. An approach known to be useful for improving performance of edge-emitting lasers is the cleaved-coupled-cavity ($C^3$) laser.

A $C^3$ laser is formed as a conventional edge-emitting laser, but following fabrication, a portion of the laser structure is separated by cleavage perpendicular to the laser emission axis. That portion is separated from the active laser device by a small distance along the laser emission axis, so that the additional optical boundary conditions associated with the additional optical cavity and with the surfaces between the active laser device and the additional optical cavity result in easier single-mode operation and in a narrower laser linewidth.

In practice, $C^3$ lasers have limited usefulness owing largely to thermal drift, which alters the resonant wavelength of the various portions of the device. In addition, it is difficult to precisely construct $C^3$ lasers to exhibit a preselected combination of properties, owing to the need to cleave or polish the portions to a length accurate to the order of 100 angstroms, and the need to handle and reposition the portions with a separation having similar accuracy. Vertical alignment of the cavity structures can also be difficult, and the resulting devices exhibit the usual limitations shared by all edge-emitting lasers.

SUMMARY OF THE INVENTION

A new class of coupled-resonator vertical-cavity lasers has been invented. These comprise vertically stacked multiple regions of electrically-pumped laser gain media, each such region being located in optically coupled resonators. Each region of laser gain media can be independently injected with current, resulting in an operating parameter space with distinct regions of optical behavior.

BRIEF DESCRIPTION OF THE ILLUSTRATIONS

FIG. 1 shows a schematic cross-section of an implementation of the instant invention.

DETAILED DESCRIPTION

The structure of a particular implementation of a coupled-resonator vertical-cavity laser CRVCL) with multiple active gain regions according to the instant invention is shown in FIG. 1. The drawing is not to scale. This implementation is described as being fabricated using the GaAs/AlGaAs compound semiconductor system, but the instant invention can be implemented in a variety of semiconductor systems. Efficient operation of such devices is aided if the semiconductor materials are single crystals. The lattice mismatch between the various materials used will usually be chosen to be sufficiently small that undue degradation of device operation from the presence or formation of dislocations and other defects does not occur.

A CRVCL according to the instant invention is fabricated on top of a GaAs substrate 100 which is doped to form a base electrical terminal which forms an electrical contacts to a base distributed Bragg reflector (DBR) 116, which is located atop substrate 100.

Base DBR 116 comprises alternating layers of at least two different semiconductor materials. The alternating layers, in this example being GaAs and AlGaAs, have optical thicknesses chosen so that base DBR 116 has optical reflectivity and transmissivity suitable for the desired operation of the device.

Additionally, in the example shown in FIG. 1, the alternating layers are doped to be electrically conducting so that an electrical input to base DBR 116 pass through to the remainder of the device. This function can also be served by vias to the substrate and other similar structures.

Laser cavity structure 120 is located on top of base DBR 116. Laser cavity structure 120 comprises laser cavity DBR 109 and active laser medium stratum 121, which is sandwiched between base DBR 116 and laser cavity DBR 109. In this example, laser cavity DBR 109 is electrically conducting, and is functionally attached to laser cavity electrical terminal 108.

In this example, active laser medium stratum 121 comprises multiple GaAs quantum wells 112 which are sandwiched between AlGaAs barrier layers 113. Active laser medium stratum 121 further comprises electrically conducting spacing layers 111 and 114, which cap the sandwich of barrier layers 113 and quantum wells 112.

In the example of FIG. 1, laser cavity structure 120 further comprises current concentration structure 110 and current concentration structure 115. Both these current concentration structures comprise an insulating layer with an aperture, the aperture positioned where the highest current concentration, and hence the maximum laser activity, is desired. The insulating layer can consist essentially of an oxidized semiconductor layer.

A second laser cavity structure 130 is located atop the first laser cavity structure 120. Laser cavity structure 130 comprises laser cavity DBR 102 and active laser medium stratum 131, which is sandwiched between laser cavity DBR 109 and laser cavity DBR 102.

In this example, laser cavity DBR 102 is electrically conducting, and is functionally attached to laser cavity electrical terminal 101. Laser cavity DBR 102 also comprises current concentration structure 103. Current concentration structure 103 comprises an annular region within laser cavity DBR 102, where the material in the annular region has been damaged by ion implantation so as to reduce the electrical conductivity of the annular region. Current passing from laser cavity electrical terminal 101 through laser cavity DBR 102 to the remainder of the device is thereby forced to primarily pass through the aperture within current concentration structure 103.

In this example, active laser medium stratum 131 comprises multiple GaAs quantum wells 105 which are sandwiched between AlGaAs barrier layers 106. Active laser medium stratum 131 further comprises electrically conducting spacing layers 104 and 107, which cap the sandwich of barrier layers 106 and quantum wells 105.

The thicknesses of laser cavity structures 120 and 130 are adjusted so that they are an integral number of their respective operating wavelengths in optical thickness. Note that the operating wavelength of laser cavity structures 120 and 130 need not be the same.

The coupling of the two laser cavity structures through laser cavity DBR 109 shifts the resonant modes of the device from those of the isolated laser cavity structures alone. When the isolated resonant modes have the same wavelength, the coupling between the cavities produces a splitting of the modes.

The resonant modes are split in wavelength by their coupling by an amount ranging from vanishingly small in the case where laser cavity DBR 109 is very thick (hence producing very little coupling), to a wavelength splitting of several percent when laser cavity DBR 109 is only a few pairs of layers in thickness, leading to very strong coupling between the resonators.

The CRVCL structure in FIG. 1 is configured as a three-terminal electrically driven device. Any of the electrical terminals (101, 108, or 100) can act as a source or drain for the other electrical terminals. This allows independent control of the current density in either of the active laser medium strata 121 and 131.

Applicants fabricated a CRVCL structure similar to that shown in FIG. 1. The structure was grown on a p-doped GaAs substrate. The base DBR was a p-type AlGaAs/GaAs distributed Bragg reflector with 35 periods of quarter-wave thickness layers. An AlGaAs layer was grown on top of the base DBR, and was selectively oxidized in an annular pattern so that the portion of the layer in the annulus became greatly reduced in electrical conductivity.

A first active laser medium stratum was grown on the proceeding structure. A first layer of p-type GaAs was grown on top of the selectively oxidized AlGaAs layer. This was followed by 6 AlGaAs barrier layers with 5 GaAs quantum wells with a thickness of 8 nanometers interleaved between them, and a layer of n-type GaAs. The total optical thickness of the p-type GaAs layer, the barrier layers, the quantum wells, and the n-type GaAs layer was one wavelength at the resonant wavelength of the laser cavity structure.

On top of the structure described above was grown another AlGaAs layer which is selectively oxidized in an annular pattern. On top of this was grown a n-type AlGaAs/GaAs laser cavity DBR with 11.5 periods. This amount of coupling produces a resonant mode splitting of about 1.4%.

A second active laser medium stratum was then grown on top of the proceeding structure, consisting essentially of a first layer of n-type GaAs was grown on top of the selectively oxidized AlGaAs layer. This was followed by 6 AlGaAs barrier layers with 5 GaAs quantum wells with a thickness of 8 nanometers interleaved between them, and a layer of p-type GaAs. The total optical thickness of the n-type GaAs layer, the barrier layers, the quantum wells, and the p-type GaAs layer was one wavelength at the resonant wavelength of the laser cavity structure.

Finally, a p-type AlGaAs/GaAs laser cavity DBR with 22 periods was grown on top of the proceeding structure. An annular region of the 22-period laser cavity DBR was implanted with protons to produce current confinement.

Following a two-tier etch, electrical terminals were formed on the topmost laser cavity DBR and on the middle laser cavity DBR. Electrical contact to the base DBR was made through the GaAs substrate.

A CRVCL structure after the instant invention can attain very high single mode output power. In conventional vertical-cavity surface-emitting lasers, the active gain volume is restricted by the onset of multimode operation.

However, in a coupled resonator device, the amplification of undesired modes is greatly reduced by the separation of the gain medium into two coupled active cavities. As a result, the limiting single mode output power is greatly increased over those which are possible in conventional VCSEL devices.

The relative intensities of the fundamental lasing mode and the various competing modes change dramatically as a function of the currents injected into the two active cavities. Applicants have achieved a record Gaussian single-mode output of 5.2 milliwatts in a device similar to that described above. This required injection of 5 milliamps into the first terminal, and 13.7 milliamps into the second terminal. Under these conditions, the next highest-order lasing mode has 32 dB lower intensity.

However, if 6.5 milliamps is injected into the second terminal, the intensity difference between the low-order lasing modes is only about 10 dB, whereas if 4 milliamps, or 11.5 milliamps, is injected, the intensity difference is about 45–50 dB. Above about 17 milliamps, there is essentially no difference between the intensity of the two strongest lasing modes. Production of efficient single-mode operation appears to be controlled by several physical mechanisms, including saturable absorption and thermal rollover effects.

Description of the specific implementations above is not intended to limit the scope of the invention. The scope of the invention is intended to be set by the claims in view of the specification and the drawings.

What is claimed is:

1. A coupled-resonator vertical-cavity laser having a fundamental laser mode at a desired operating wavelength, said laser comprising:
   a) a base distributed Bragg reflector, comprising alternating layers of at least two electrically conducting single crystal semiconductor materials;
   b) a base electrical terminal functionally attached to the base distributed Bragg reflector;
   c) a first laser cavity having a first laser cavity resonant wavelength not equal to said desired operating wavelength, comprising:
      i) a first laser cavity distributed Bragg reflector positioned above the base distributed Bragg reflector, said first laser cavity distributed Bragg reflector having a reflector thickness and comprising alternating layers of at least two electrically conducting single crystal semiconductor materials, said first laser cavity distributed Bragg reflector being separated from said base distributed Bragg reflector by an optical thickness substantially equal to an integral number of said first laser cavity resonant wavelength;

ii) a first active laser medium disposed between the base distributed Bragg structure and the first laser cavity distributed Bragg reflector; and, iii) a first laser cavity electrical terminal functionally connected to the first laser cavity distributed Bragg reflector; and, d) a second laser cavity having a second laser cavity resonant wavelength not equal to said operating wavelength, comprising:

i) a second laser cavity distributed Bragg reflector positioned above the first laser cavity distributed Bragg reflector, said second laser cavity distributed Bragg reflector comprising alternating layers of at least two electrically conducting single crystal semiconductor materials, and being separated from said first laser cavity distributed Bragg reflector by an optical thickness substantially equal to an integral number of said second laser cavity resonant wavelength;

ii) a second active laser medium disposed between the second laser cavity distributed Bragg structure and the first laser cavity distributed Bragg reflector; and, iii) a second laser cavity electrical terminal functionally connected to the second laser cavity distributed Bragg reflector, wherein said reflector thickness is configured so that the first laser cavity and the second laser cavity are thereby optically coupled so that the fundamental laser mode of the coupled-resonator vertical cavity laser is at the desired operating wavelength, and so that other laser modes are substantially suppressed relative to the fundamental laser mode.

2. The coupled-resonator vertical cavity laser of claim 1, wherein at least one chosen from the group consisting of said first active laser medium or said second active laser medium comprises at least one active quantum well.

3. The coupled-resonator vertical-cavity laser of claim 1, wherein each of said first laser medium and said second laser medium comprises at least one active quantum well.

4. The coupled-resonator vertical-cavity laser of claim 1, wherein at least one of the group consisting of said first active laser medium and said second active laser medium comprises multiple active quantum wells.

5. The coupled-resonator vertical-cavity laser of claim 1, wherein each of said first laser medium and said second laser medium comprises multiple active quantum wells.

6. The coupled-resonator vertical-cavity laser of claim 1, further comprising at least one current concentration structure.

7. The coupled-resonator vertical-cavity laser of claim 1, wherein said first laser cavity resonant wavelength and said second laser cavity resonant wavelength are substantially equal.

* * * * *